(12) United States Patent
Jian

(10) Patent No.: US 8,704,077 B2
(45) Date of Patent: Apr. 22, 2014

(54) HEAT RECYCLING SYSTEM

(75) Inventor: Zh-Wei Jian, Taipei Hsien (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 1215 days.

(21) Appl. No.: 12/549,378

(22) Filed: Aug. 28, 2009

(65) Prior Publication Data

US 2011/0011098 A1 Jan. 20, 2011

(30) Foreign Application Priority Data

Jul. 15, 2009 (CN) .......................... 2009 1 0304349

(51) Int. Cl.
*H01L 35/02* (2006.01)

(52) U.S. Cl.
USPC ............... 136/208; 136/205; 136/203; 62/3.2

(58) Field of Classification Search
USPC .............................. 136/208, 205, 203; 62/3.2
See application file for complete search history.

(56) References Cited

U.S. PATENT DOCUMENTS

| | | | | |
|---|---|---|---|---|
| 2,919,553 A | * | 1/1960 | Fritts ................................. | 62/3.3 |
| 2,959,925 A | * | 11/1960 | Frantti et al. ...................... | 62/3.3 |
| 2,996,889 A | * | 8/1961 | Roeder, Jr. ........................ | 62/3.3 |
| 3,054,840 A | * | 9/1962 | Alsing ............................ | 136/204 |
| 3,097,027 A | * | 7/1963 | Mims et al. .................... | 384/476 |
| 3,127,749 A | * | 4/1964 | Bergvall et al. .................. | 62/3.2 |
| 3,269,872 A | * | 8/1966 | Thompson ..................... | 136/208 |
| 3,400,452 A | * | 9/1968 | Emley ............................. | 136/201 |
| 3,648,470 A | * | 3/1972 | Schultz .............................. | 62/3.5 |
| 3,833,428 A | * | 9/1974 | Snyder et al. .................. | 136/202 |
| 3,900,603 A | * | 8/1975 | Rittmayer et al. ............. | 148/537 |
| 3,945,855 A | * | 3/1976 | Skrabek et al. ................ | 136/238 |
| 4,011,104 A | * | 3/1977 | Basiulis ......................... | 136/205 |
| 4,092,140 A | * | 5/1978 | Cerutti et al. ................... | 65/99.3 |
| 4,095,998 A | * | 6/1978 | Hanson .......................... | 136/208 |
| 4,125,122 A | * | 11/1978 | Stachurski ..................... | 136/205 |
| 4,249,121 A | * | 2/1981 | Dahlberg ........................ | 322/2 R |
| 4,312,402 A | * | 1/1982 | Basiulis ...................... | 165/104.22 |
| 4,463,214 A | * | 7/1984 | Lowther ......................... | 136/208 |
| 4,497,973 A | * | 2/1985 | Heath et al. ................... | 136/212 |
| 4,520,305 A | * | 5/1985 | Cauchy .......................... | 322/2 R |
| 4,566,961 A | * | 1/1986 | Diaz et al. ..................... | 204/168 |
| 4,677,416 A | * | 6/1987 | Nishimoto et al. ............. | 338/35 |
| 4,802,929 A | * | 2/1989 | Schock .......................... | 136/205 |
| 5,228,923 A | * | 7/1993 | Hed ............................... | 136/208 |
| 5,286,304 A | * | 2/1994 | Macris et al. .................. | 136/201 |
| 5,505,835 A | * | 4/1996 | Sakaue et al. ............. | 204/192.26 |
| 6,046,398 A | * | 4/2000 | Foote et al. .................... | 136/201 |

(Continued)

FOREIGN PATENT DOCUMENTS

| CN | 1946927 A | 4/2007 |
|---|---|---|
| CN | 101325386 A | 12/2008 |

*Primary Examiner* — Golam Mowla

(74) *Attorney, Agent, or Firm* — Novak Druce Connolly Bove + Quigg LLP

(57) ABSTRACT

A heat recycling system for recycling heat from an electronic device includes a pipe with an inside tube and an outside tube coiled around the inside tube. The inside tube is connected to a first airduct to receive heated air from the electronic device. The outside tube is to receive cooling air from outside. A number of thermoelectric modules are formed in walls of the inside tube. A first end of each thermoelectric module is inserted into the outside tube, and a second end of each thermoelectric module is inserted into the inside tube. Therefore, the number of thermoelectric modules may generate current.

9 Claims, 2 Drawing Sheets

(56) References Cited

U.S. PATENT DOCUMENTS

| | | | |
|---|---|---|---|
| 6,096,964 A * | 8/2000 | Ghamaty et al. | 136/201 |
| 6,207,887 B1 * | 3/2001 | Bass et al. | 136/201 |
| 6,215,580 B1 * | 4/2001 | Kouta | 359/328 |
| 6,637,210 B2 * | 10/2003 | Bell | 62/3.7 |
| 6,700,052 B2 * | 3/2004 | Bell | 136/201 |
| 7,777,126 B2 * | 8/2010 | Chu | 136/208 |
| 2002/0148236 A1 * | 10/2002 | Bell | 62/3.3 |
| 2004/0094192 A1 * | 5/2004 | Luo | 136/203 |
| 2007/0193617 A1 | 8/2007 | Taguchi | |

\* cited by examiner

HEAT RECYCLING SYSTEM

BACKGROUND

1. Technical Field

The present disclosure relates to a heat recycling system.

2. Description of Related Art

With advances in electronic technology, modern computer components and other electronic components can operate at high speeds and frequencies, and these electronic components typically generate large amount of heat. There are numerous kinds of heat-dissipating devices used to cool the electronic components. However, all the heat-dissipating devices only focus on how to dissipate heat from the electronic components, without adequately considering how to recycle the generated heat to save energy and preserve the environment.

DETAILED DESCRIPTION

Figure 1:
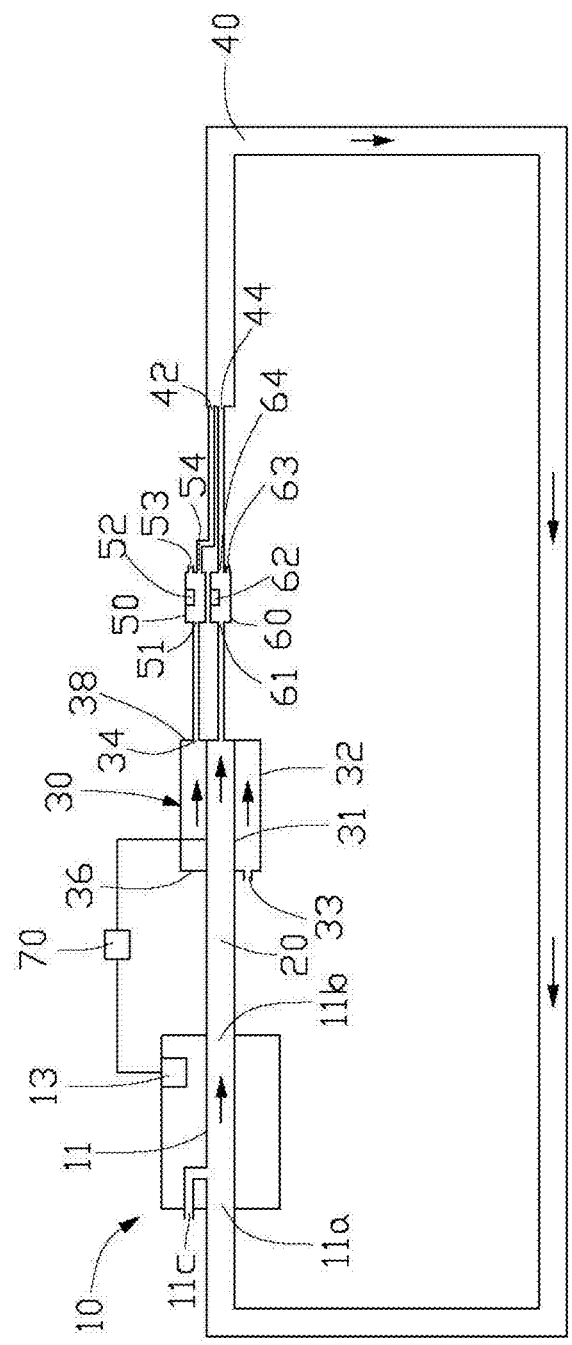
FIG. 1 is a schematic diagram of an exemplary embodiment of a heat recycling system, the heat recycling system includes a pipe.

Referring to FIG. 1, an exemplary embodiment of a heat recycling system 1 to recycle heat generated by an electronic device 10 includes a first airduct 20, a pipe 30, a second airduct 40, a first air controller 50, a second air controller 60, and a storage apparatus, such as a capacitor 70, for storing electric charge.

The electronic device 10 includes a heat channel 11 and a power circuit 13. The heat channel 11 dissipates heat generated by the electronic device 10 to the surrounding air. The heat channel 11 includes a first air inlet 11a, a first air outlet 11b, and a second air inlet 11c. It can be understood that the heat channel 11 is typical of heat channels used in computer systems. The power circuit 13 provides power to the electronic device 10.

A first end of the first airduct 20 is connected to the first air outlet 11b of the heat channel 11.

Figure 2:
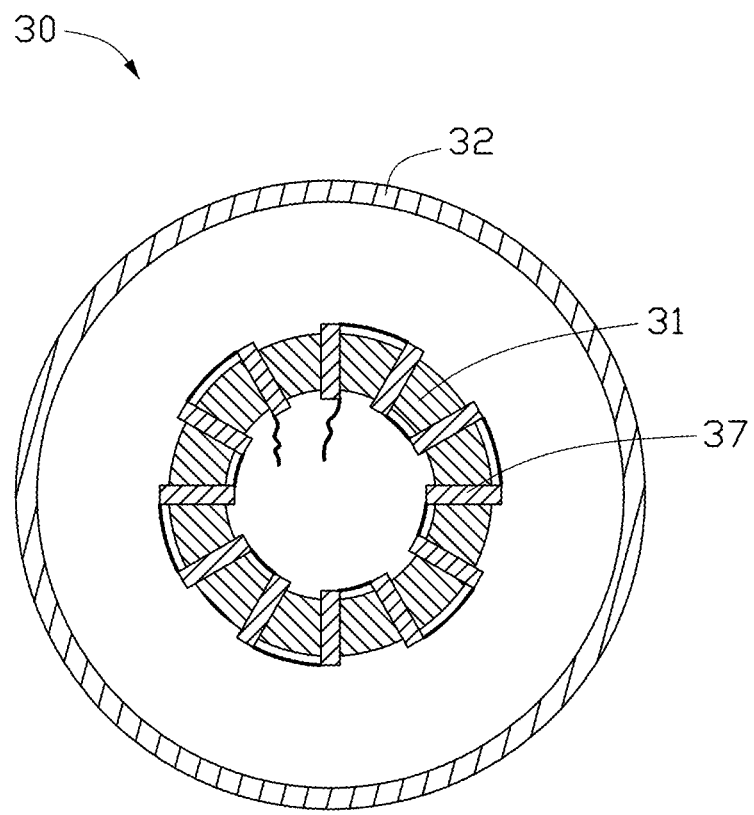
FIG. 2 is a sectional view of the pipe in FIG. 1.

Referring to FIG. 2, the pipe 30 includes an inside tube 31 and an outside tube 32 coiled around the inside tube 31. A first end of the inside tube 31 is connected to a second end of the first airduct 20. The outside tube 32 defines a third air inlet 33 and a second air outlet 34.

The outside tube 32 directs airflow. A plurality of thermoelectric modules 37 are radially embedded in walls of the inside tube 31. A first end of each thermoelectric module 37 is inserted into a space between the outside tube 32 and the inside tube 31. A second end of each thermoelectric module 37 is inserted into an inner space of the inside tube 31. The plurality of thermoelectric modules 37 are connected in series. One thermoelectric module 37, which is located at the head, and another thermoelectric module 37, which is located at the end, are connected to opposite ends of the capacitor 70, respectively.

Each thermoelectric module 37 converts a temperature difference between opposite ends of the thermoelectric module 37 into a current passing through the thermoelectric module 37.

The first air controller 50 includes a fourth air inlet 51, a first temperature sensor 52, a third air outlets 53, and a fourth air outlet 54. The fourth air inlet 51 is connected to the second air outlet 34 of the outside tube 32 of the pipe 30.

The second air controller 60 includes a fifth air inlet 61, a second temperature sensor 62, a fifth air outlet 63, and a sixth air outlet 64. The fifth air inlet 61 is connected to a second end of the inside tube 31.

Two air inlets 42 and 44 are defined at a first end of the second airduct 40. The air inlet 42 is connected to the fourth air outlet 54 of the first air controller 50. The air inlet 44 is connected to the sixth air outlet 64 of the second air controller 60. A second end of the second airduct 40 is connected to the first air inlet 11a of the heat channel 11 of the electronic device 10.

In use, outside air enters into the heat channel 11 through the second air inlet 11c, to cool the electronic device 10. Air heated by the electronic device 10 from the first air outlet 11b of the heat channel 11 passes through the first airduct 20, and enters into the inside tube 31 of the pipe 30. Cooling air from outside enters into the outside tube 32 of the pipe 30 through the third air inlet 33. Therefore, the first end of each thermoelectric module 37 contacts the cooling air from outside, and the second end of each thermoelectric module 37 contacts the heated air. A temperature difference develops between the first end and the second end of each thermoelectric module 37. As a result, current is generated in each thermoelectric module 37.

The capacitor 70 is also connected to the power circuit 13 of the electronic device 10, to provide power to the electronic device 10.

Because of heat exchange between the inside tube 31 and the outside tube 32 via the plurality of thermoelectric modules 37, the temperature of airflow at the second air outlet 34 of the pipe 30 is greater than the temperature of the cooling air from outside at the third air inlet 33 of the pipe 30, and the temperature of airflow at the second end of the inside tube 31 is less than the heated air in the first airduct 20.

The first temperature sensor 52 of the first air controller 50 senses the airflow from the second air outlet 34 of the outside tube 32 of the pipe 30. Upon the condition that the temperature of the airflow from the second air outlet 34 is less than a first predetermined value, the first air controller 50 opens the fourth air outlet 54 to let the airflow pass through the second airduct 40 and enter into the electronic device 10. Upon the condition that the temperature of the airflow from the second air outlet 34 is greater than the first predetermined value, the first air controller 50 opens the third air outlet 53 to let the airflow conduct to the outside. It can be understood that the temperature of the airflow from the second air outlet 34 being less than the first predetermined value means the temperature of the airflow is low enough to cool the electronic device 10, and when the temperature of the airflow is greater than the first predetermined value, the airflow cannot cool the electronic device 10.

The second temperature sensor 62 of the second air controller 60 senses the airflow from the inside tube 31. Upon the condition that the temperature of the airflow from the inside tube 31 is less than a second predetermined value, the second air controller 60 opens the sixth air outlet 64 to let the airflow pass through the second airduct 40 and enter into the electronic device 10. Upon the condition that the temperature of the airflow from the inside tube 31 is greater than the second predetermined value, the second air controller 60 opens the fifth air outlet 63 to let the airflow conduct to outside. It can be understood that when the temperature of the airflow from the inside tube 31 is less than the second predetermined value, the airflow is cool enough to cool the electronic device 10, and when the temperature of the airflow from the inside tube 31 is greater than the second predetermined value, the airflow cannot cool the electronic device 10.

In other embodiments, the heated air from the first air outlet 11b may pass through the first airduct 20, and enter into the outside tube 32. Cooling air from Outside may enter into the inside tube 31. Therefore, a temperature difference develops between the first end and the second end of each thermoelectric module 37.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A heat recycling system for recycling heat from an electronic device, the heat recycling system comprising:
    a first airduct connected to the electronic device to receive heated air from the electronic device; and
    a pipe comprising an inside tube, and an outside tube coiled around the inside tube, wherein the inside tube is connected to the first airduct to receive the heated air with an inner space, a space between the outside tube and the inside tube is used to receive cooling air from outside, a plurality of thermoelectric modules are embedded in walls of the inside tube, a first end of each thermoelectric module is inserted into the space between the outside tube and the inside tube, and a second end of each thermoelectric module is inserted into the inner space of the inside tube.

2. The heat recycling system of claim 1, further comprising a storage apparatus to store electric charge, wherein the plurality of thermoelectric modules are connected in series, with the first one and the last one of the thermoelectric modules respectively connected to two opposite ends of the storage apparatus.

3. The heat recycling system of claim 2, wherein the storage apparatus is a capacitor.

4. The heat recycling system of claim 2, further comprising a power circuit connected to the storage apparatus.

5. The heat recycling system of claim 1, wherein the outside tube comprises an air inlet, the cooling air from outside enters into the space between the outside tube and the inside tube through the air inlet.

6. The heat recycling system of claim 1, further comprising an air controller, wherein the air controller comprises a temperature sensor, an air inlet, and a first air outlet, wherein the outside tube of the pipe comprises a second air outlet, the air inlet of the air controller is connected to the second air outlet of the outside tube, the temperature sensor senses temperature of airflow in the air controller to open or close the first air outlet of the air controller correspondingly.

7. The heat recycling system of claim 6, further comprising a second airduct, wherein the air controller further comprises a third air outlet, a first end of the second airduct is connected to the third air outlet of the air controller, a second end of the second airduct is connected to the electronic device; wherein upon the condition that the temperature of the airflow in the air controller is greater than a predetermined value, the air controller opens the first air outlet to allow the airflow to enter the open space, upon the condition that the temperature of the airflow in the air controller is less than the predetermined value, the air controller opens the third air outlet to allow the airflow to enter into the second airduct.

8. The heat recycling system of claim 1, further comprising an air controller, wherein the air controller comprises a temperature sensor, an air inlet, and a first air outlet, wherein the inside tube comprises a second air outlet, the air inlet of the air controller is connected to the second air outlet of the inside tube, the temperature sensor senses temperature of airflow in the air controller to open or close the first air outlet of the air controller correspondingly.

9. The heat recycling system of claim 8, further comprising a second airduct, wherein the air controller further comprises a third air outlet, a first end of the second airduct is connected to the third air outlet of the air controller, a second end of the second airduct is connected to the electronic device; wherein upon the condition that the temperature of the airflow in the air controller is greater than a predetermined value, the air controller opens the first air outlet to allow the airflow to enter the open space, upon the condition that the temperature of the airflow in the air controller is less than the predetermined value, the air controller opens the third air outlet to allow the airflow to enter into the second airduct.

* * * * *